United States Patent
Wu et al.

(10) Patent No.: US 10,230,160 B2
(45) Date of Patent: Mar. 12, 2019

(54) WIRELESS COMMUNICATION SYSTEM AND WEARABLE ELECTRONIC DEVICE INCLUDING THE SAME

(71) Applicant: PEGATRON CORPORATION, Taipei (TW)

(72) Inventors: Chien-Yi Wu, Taipei (TW); Ching-Hsiang Ko, Taipei (TW); Chao-Hsu Wu, Taipei (TW); Shih-Keng Huang, Taipei (TW); Ya-Jyun Li, Taipei (TW); Yu-Yi Chu, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 15/798,380

(22) Filed: Oct. 30, 2017

(65) Prior Publication Data

US 2018/0198192 A1   Jul. 12, 2018

(30) Foreign Application Priority Data

Jan. 10, 2017  (TW) .............................. 106100664 A

(51) Int. Cl.
*H01Q 1/24* (2006.01)
*H01Q 1/27* (2006.01)
(Continued)

(52) U.S. Cl.
CPC ............. *H01Q 1/273* (2013.01); *H01Q 1/243* (2013.01); *H01Q 1/48* (2013.01); *H01Q 5/307* (2015.01);
(Continued)

(58) Field of Classification Search
CPC .......... H01Q 1/273; H01Q 1/24; H01Q 1/243; H01Q 1/48; H01Q 7/00
See application file for complete search history.

(56) References Cited

U.S. PATENT DOCUMENTS

2009/0305657 A1* 12/2009 Someya ................ H01Q 1/273
                                                                    455/269
2015/0048979 A1*  2/2015 Asrani .................. H01Q 1/243
                                                                    343/702
(Continued)

FOREIGN PATENT DOCUMENTS

TW        201626121 A       7/2016

OTHER PUBLICATIONS

K.L. Wong and S.N. Hsu, "Small-size two-branch monopole antenna with integrated wideband matching network for LTE tablet computer", Microwave and Opt. Technol. Lett., vol. 57, No. 2, pp. 507-513, Feb. 2015, Wiley Periodicals, Inc.

(Continued)

*Primary Examiner* — Hoang V Nguyen
(74) *Attorney, Agent, or Firm* — Winston Hsu

(57) ABSTRACT

A wireless communication system disposed at a wearable electronic device. The wearable electronic device includes a metallic accommodating housing and a first metallic curved piece. The first metallic curved piece is protrudingly disposed at one side of the metallic accommodating housing. The wireless communication system includes a circuit board, a first insulation cover and a first loop antenna. The circuit board is coupled with the first loop antenna to generate a first wireless radio-frequency signal. The first insulation cover surrounds the first metallic curved piece. The first antenna generates a first band and a second band by resonance according to the first wireless radio-frequency signal after electromagnetically coupled with the first metallic curved piece.

22 Claims, 10 Drawing Sheets

(51) Int. Cl.
   *H04B 1/3827*  (2015.01)
   *H01Q 1/48*    (2006.01)
   *H05K 1/02*    (2006.01)
   *H01Q 7/00*    (2006.01)
   *H01Q 5/307*   (2015.01)

(52) U.S. Cl.
   CPC .............. *H01Q 7/00* (2013.01); *H04B 1/385* (2013.01); *H05K 1/0237* (2013.01)

(56) References Cited

U.S. PATENT DOCUMENTS

| | | | |
|---|---|---|---|
| 2015/0091764 A1* | 4/2015 | Hsieh | H01Q 5/364 343/702 |
| 2015/0255855 A1* | 9/2015 | Tsai | H01Q 1/273 343/702 |
| 2016/0056533 A1* | 2/2016 | Nissinen | H01Q 9/0421 343/702 |
| 2016/0294038 A1 | 10/2016 | Lo | |

OTHER PUBLICATIONS

K.L. Wong, M.F. Tu, T.Y. Wu and W.Y. Li, "Small-size coupled-fed printed PIFA for internal eight-band LTE/GSM/UMTS mobile phone antenna", Microwave and Opt. Technol. Lett., vol. 52, No. 9, pp. 2123-2128, Sep. 2010, Wiley Periodicals, Inc.

\* cited by examiner

WIRELESS COMMUNICATION SYSTEM AND WEARABLE ELECTRONIC DEVICE INCLUDING THE SAME

CROSS REFERENCE TO RELATED APPLICATION

This application claims the priority benefits of Taiwan Patent Application No. 106100664, filed on Jan. 10, 2017. The entirety of the above-mentioned patent applications are hereby incorporated by references herein and made a part of specification.

BACKGROUND OF THE INVENTION

1. Field of the Invention

The invention relates to a wireless communication system and a wearable electronic device including the same and, in particular, to a wireless communication system using two flexible circuit board antennas to transmit and receive wireless radio-frequency signals, and a wearable electronic device including the wireless communication system mentioned above.

2. Description of the Prior Art

With the advancement of technology, a variety of wearable electronic devices, such as the smart watch sold by Apple Inc. and the smart wristband by Sony Corporation, have been widely used in daily life. These wearable electronic devices have the advantages of low power consumption, light weight and high performance, and support wireless network transmissions.

To support different network transmission standards, conventional wearable electronic devices use different antenna modules to transmit and receive signals of different heterogeneous networks. For example, a wearable electronic device may include an antenna for transmitting and receiving 3G mobile telecommunication signals, an antenna for transmitting and receiving GPS (Global Positioning System) signals, and an antenna for transmitting and receiving Bluetooth or Wi-Fi signals. These antennas co-exist in the wearable electronic device.

However, since modern wearable electronic devices gradually have the trends of miniaturization and lightweight, when disposing three antennas into a limited space in the housing, the performance of some of the antennas may be reduced because the ground plane of the wearable electronic device is too small. For example, when the area of the ground plane is too small, the antenna space for the $3^{rd}$ Generation telecommunication technology would be limited. This makes it difficult for the low frequency portion of the wireless radio-frequency signal to generate matching bandwidth by resonance, which results in poor VSWR (Voltage Standing Wave Ratio) performance and antenna efficiency.

SUMMARY OF THE INVENTION

One embodiment of the invention provides a wireless communication system disposed at a wearable electronic device. The wearable electronic device includes a metallic accommodating housing and a first metallic curved piece. The metallic accommodating housing includes an upper surface and a lower surface, the lower surface being used as a ground plane. The first metallic curved piece is protrudingly disposed at one side of the metallic accommodating housing. The wireless communication system includes a circuit board, a first insulation cover and a first loop antenna. The circuit board is accommodated at the metallic accommodating housing for providing a first wireless radio-frequency signal. The first insulation cover wraps around the metallic accommodating housing and covers a portion of the upper surface, one side of the first insulation cover surrounding the first metallic curved piece. The first loop antenna is disposed at a side of the first insulation cover opposite to the side surrounding the first metallic curved piece. The first loop antenna includes a first radiator, a second radiator and a third radiator. One end of the first radiator is coupled with the first metallic curved piece and another end is coupled with the lower surface. The second radiator is attached to the first insulation cover and is coupled with the lower surface via the circuit board. The third radiator is attached to the first insulation cover and includes a first feed terminal. The first feed terminal is coupled with the circuit board to receive the first wireless radio-frequency signal. The first loop antenna generates a first band and a second band by resonance according to the first wireless radio-frequency signal after electromagnetically coupled with the first metallic curved piece.

Another embodiment of the invention provides a wearable electronic device, including a metallic accommodating housing, a first metallic curved piece and a wireless communication system. The metallic accommodating housing includes an upper surface and a lower surface, the lower surface being used as a ground plane. The first metallic curved piece is protrudingly disposed at one side of the metallic accommodating housing. The wireless communication system includes a circuit board, a first insulation cover and a first loop antenna. The circuit board is accommodated at the metallic accommodating housing for providing a first wireless radio-frequency signal. The first insulation cover wraps around the metallic accommodating housing and covers a portion of the upper surface, one side of the first insulation cover surrounding the first metallic curved piece. The first loop antenna is disposed at a side of the first insulation cover opposite to the side surrounding the first metallic curved piece. The first loop antenna includes a first radiator, a second radiator and a third radiator. One end of the first radiator is coupled with the first metallic curved piece and another end is coupled with the lower surface. The second radiator is attached to the first insulation cover and is coupled with the lower surface via the circuit board. The third radiator is attached to the first insulation cover and includes a first feed terminal. The first feed terminal is coupled with the circuit board to receive the first wireless radio-frequency signal. The first loop antenna generates a first band and a second band by resonance according to the first wireless radio-frequency signal after electromagnetically coupled with the first metallic curved piece.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
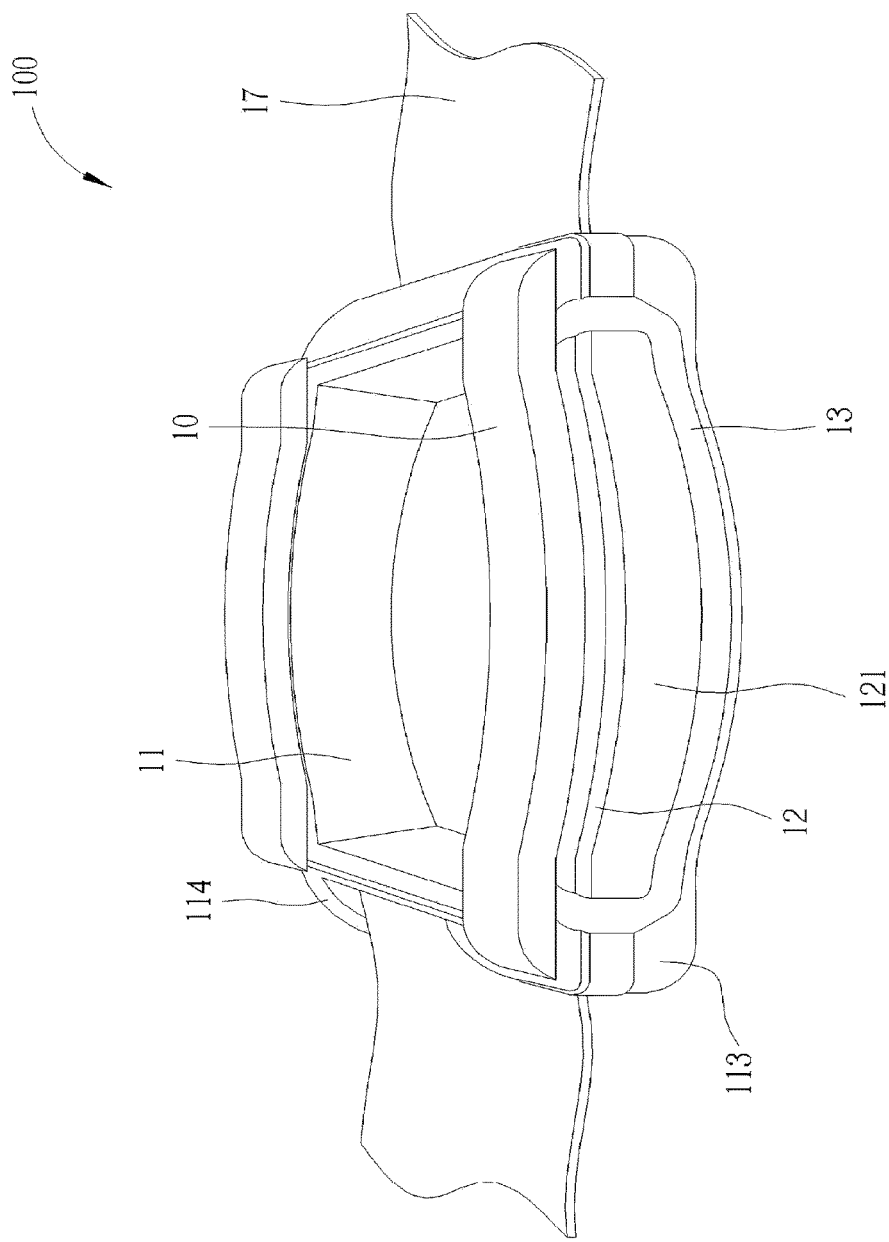
FIG. 1 is a schematic diagram showing the wearable electronic device according to an embodiment of the invention viewed from a first view angle.
Figure 2:
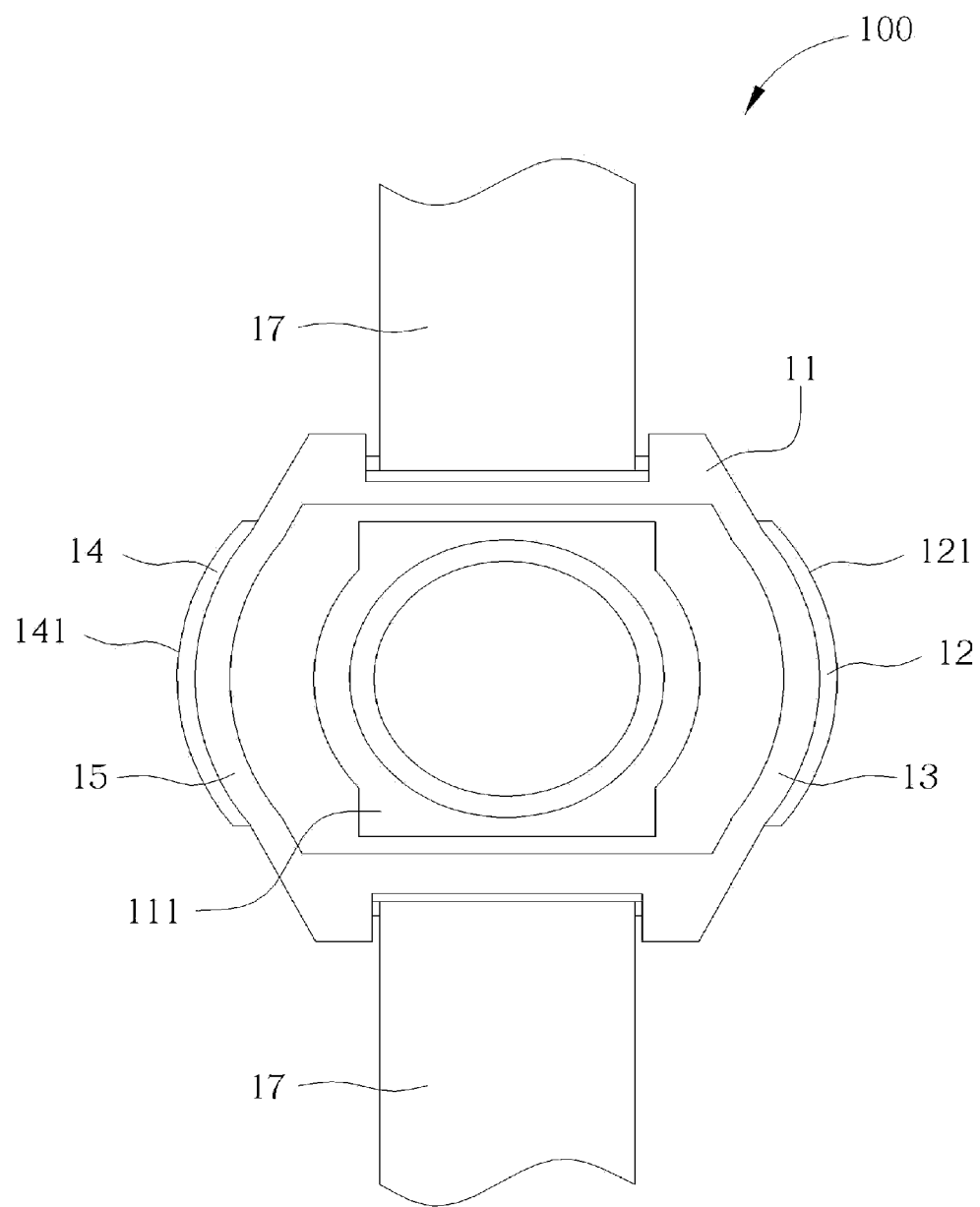
FIG. 2 is a schematic diagram showing the wearable electronic device shown in FIG. 1 viewed from a second view angle.
Figure 3:
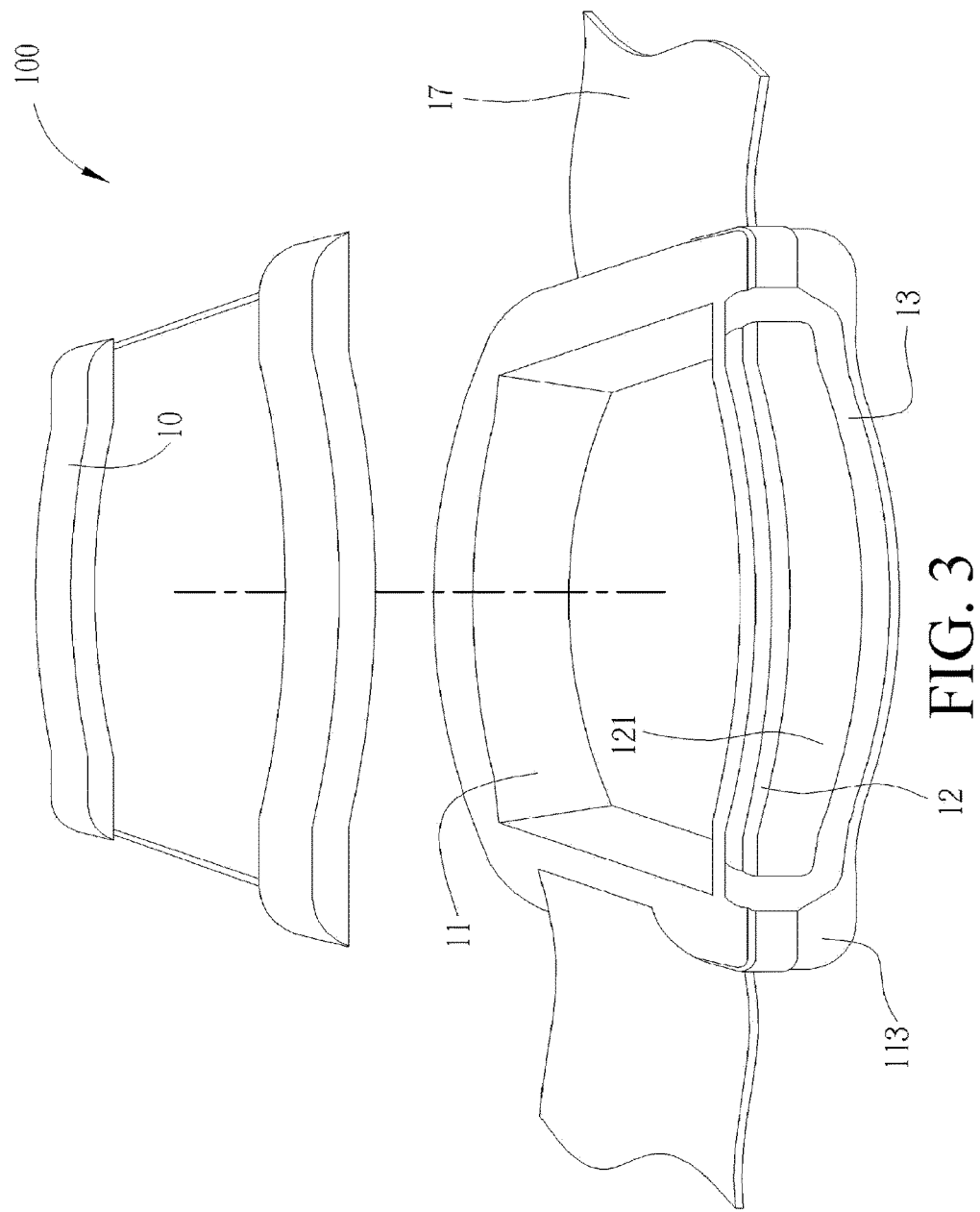
FIG. 3 is an exploded diagram of the wearable electronic device.
Figure 4:
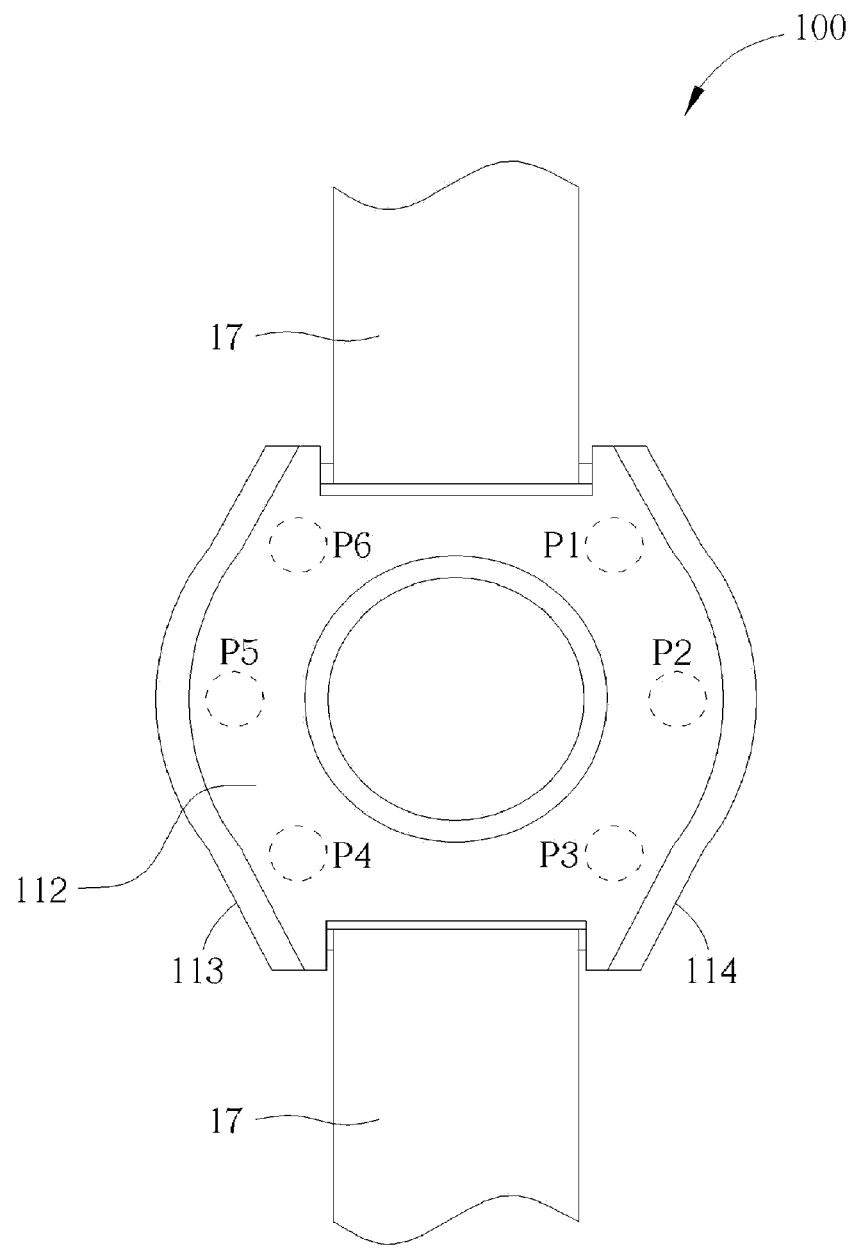
FIG. 4 is a schematic diagram of the wearable electronic device shown in FIG. 1 viewed from a third view angle.
Figure 5:
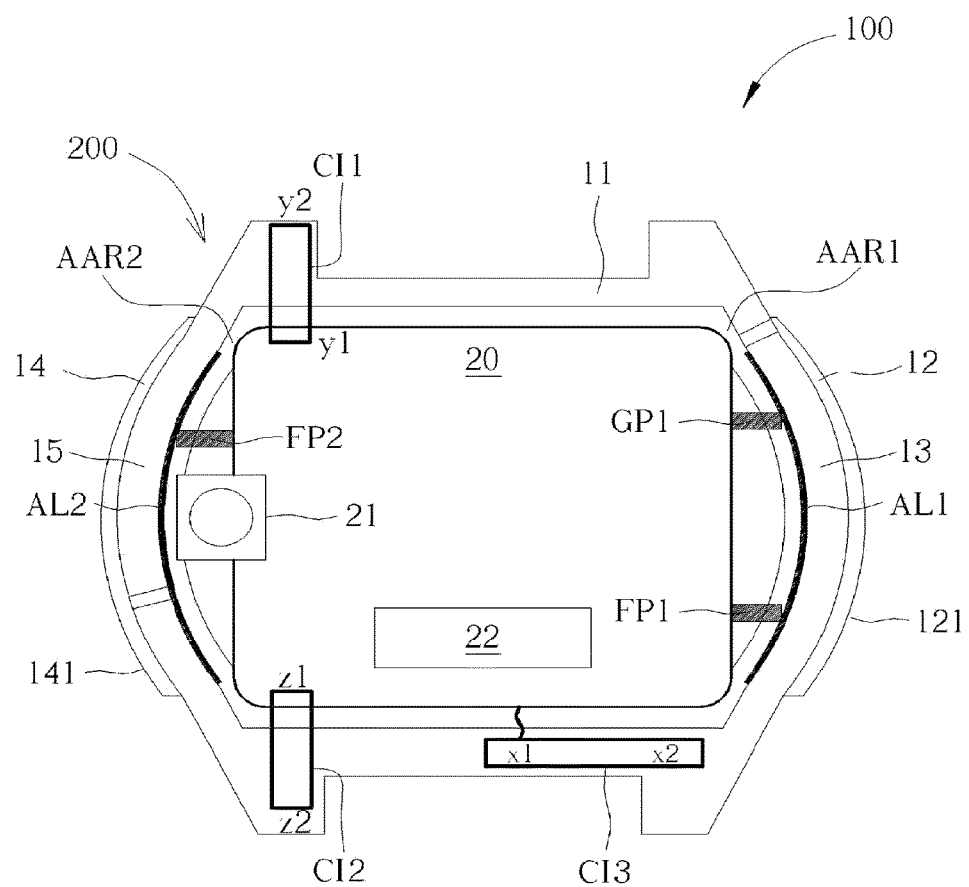
FIG. 5 is a schematic diagram showing the wearable electronic device shown in FIG. 1 combined with a wireless communication system.
Figure 6:
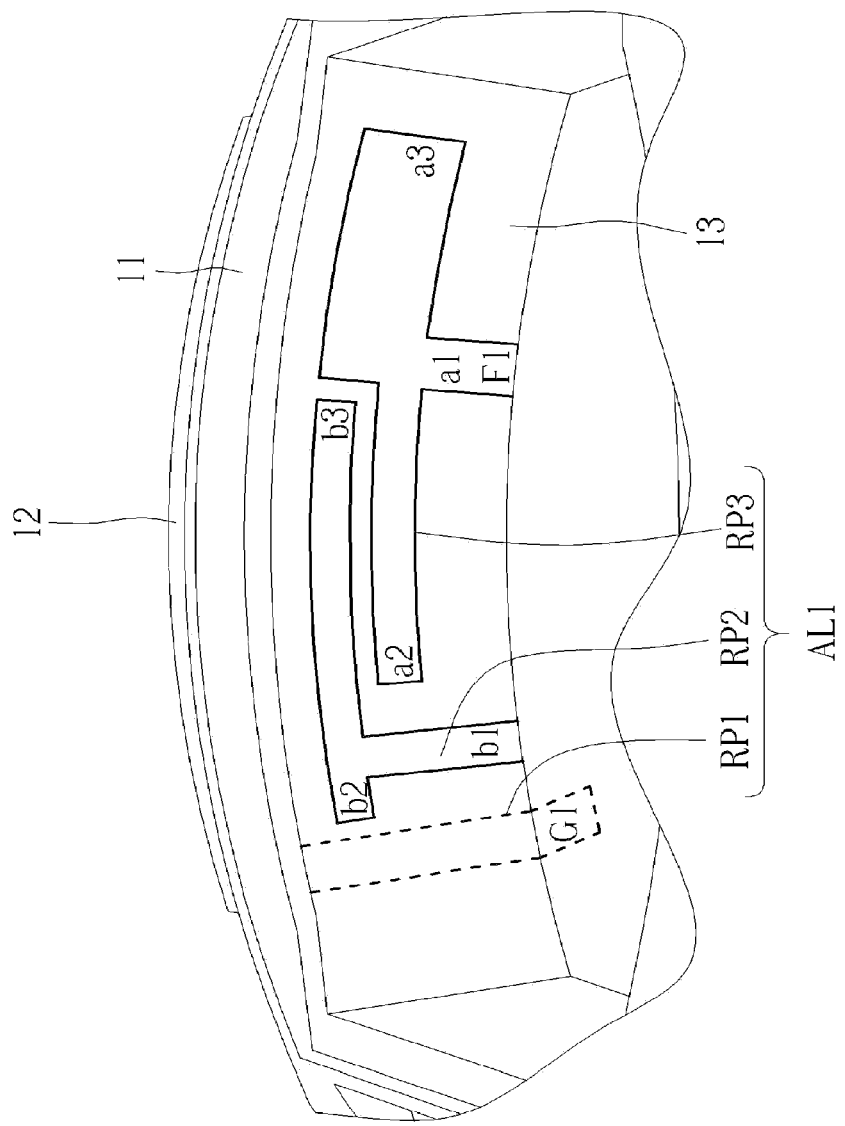
FIG. 6 is a schematic diagram showing the first loop antenna and the first metallic curved piece and the metallic accommodating housing in the wireless communication system shown in FIG. 5.
Figure 7:
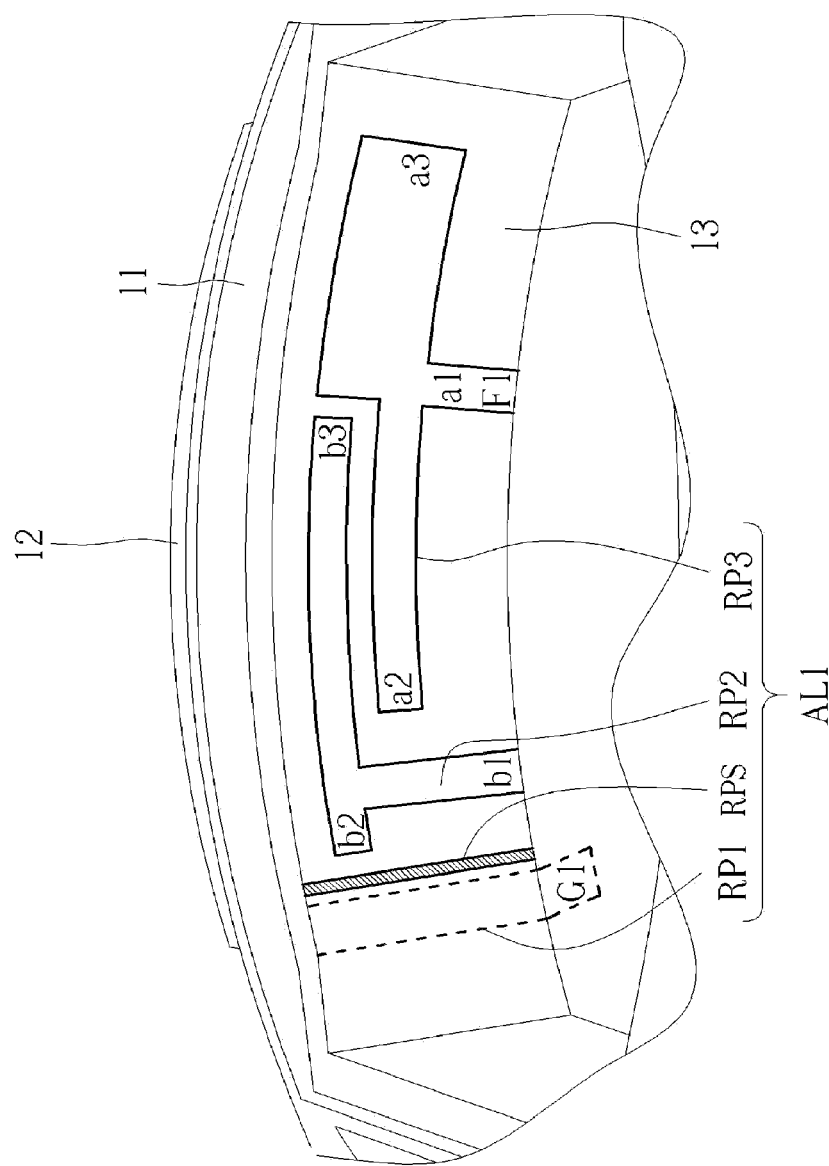
FIG. 7 is a schematic diagram showing the sixth radiator being introduced into the first loop antenna AL1 and the first metallic curved piece and the metallic accommodating housing in the wireless communication system of FIG. 5.
Figure 8:
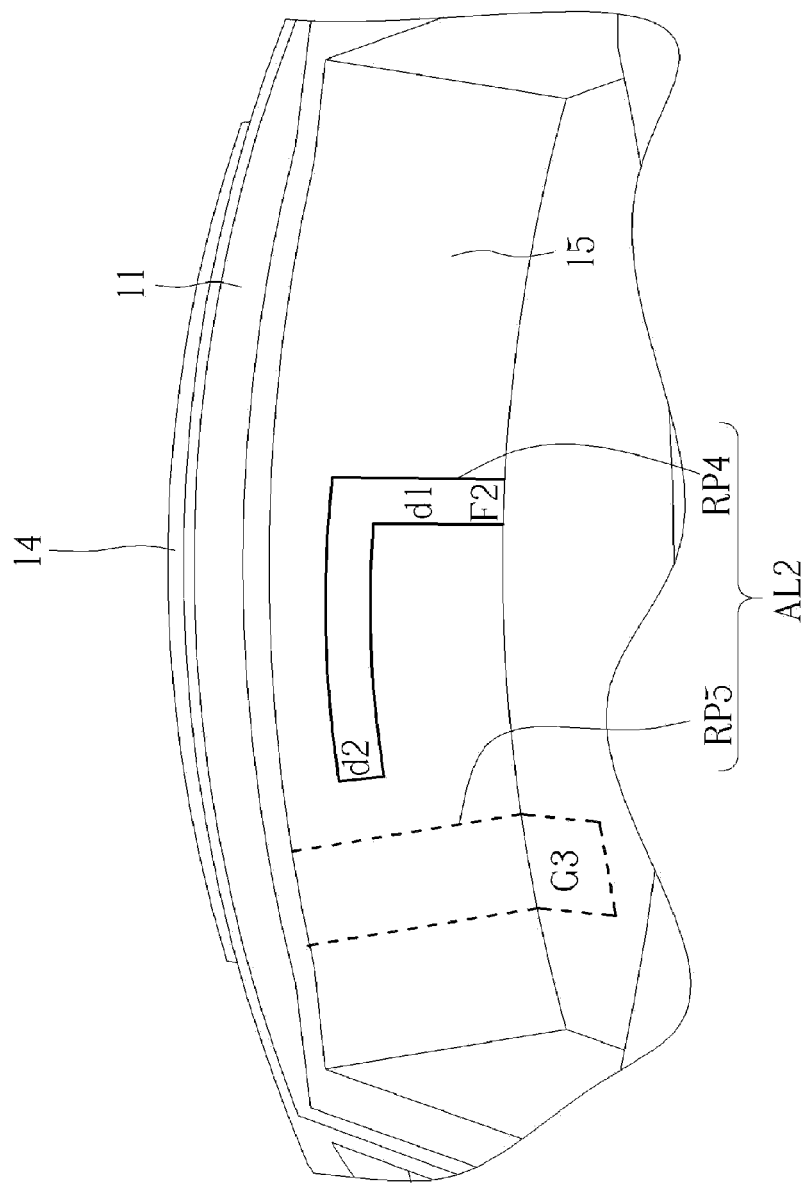
FIG. 8 is a schematic showing the second loop antenna, the second metallic curved piece and the metallic accommodating housing in the wireless communication system of FIG. 5.

FIG. 1 is a schematic diagram showing the wearable electronic device 100 according to an embodiment of the invention viewed from a first view angle. FIG. 2 is a schematic diagram of the wearable electronic device 100 (not including the metallic top cover) viewed from a second view angle. FIG. 3 is an exploded diagram of the wearable electronic device 100. FIG. 4 is a schematic diagram of the wearable electronic device 100 viewed from a third view angle. FIG. 5 is a schematic diagram showing the wearable electronic device 100 (not including the metallic belt) combined with a wireless communication system 200. FIG. 6 is a schematic diagram showing the first loop antenna AL1 and the first metallic curved piece 12 and the metallic accommodating housing 11. FIG. 7 is a schematic diagram showing the sixth radiator RPS being introduced into the first loop antenna AL1 and the first metallic curved piece 12 and the metallic accommodating housing 11 in the wireless communication system 200 of FIG. 5. FIG. 8 is a schematic showing the second loop antenna AL2, the second metallic curved piece 14 and the metallic accommodating housing 11 in the wireless communication system 200 of FIG. 5. In the present embodiment, the first view angle may be the upper-right view angle, the second view angle may be the front view angle, and the third view angle may be the front view angle of the back of the wearable electronic device 100. The wearable electronic device 100 of the embodiment may be an electronic watch, and FIG. 1 to FIG. 8 illustrate the outer appearances of the electronic watch from different view angles. However, the architecture of the wearable electronic device 100 of the embodiment is not limited by FIG. 1 to FIG. 8. Any reasonable variation of the hardware, size, pattern, figure, structure or material is within the scope of the invention.

Referring to FIG. 1 to FIG. 5, the embodiment provides a wearable electronic device 100 including a metallic accommodating housing 11, a first metallic curved piece 12 and a wireless communication system 200. The metallic accommodating housing 11 has a concave structure including an upper surface 111, a lower surface 112, a first sidewall 113 and a second sidewall 114, wherein the first sidewall 113 is disposed with respect to the second sidewall 114. The first metallic curved piece 12 is protrudingly disposed at the outside of the first sidewall 113 of the metallic accommodating housing 11. The wireless communication system 200 includes a circuit board 20, a first insulation cover 13 and a first loop antenna AL1. The circuit board 20 is accommodated in the metallic accommodating housing 11, and is for providing a first wireless radio-frequency signal. The first insulation cover 13 wraps around the metallic accommodating housing 11 and covers a portion of the upper surface 111 of the metallic accommodating housing 11. One side of the first insulation cover 13 surrounds the first metallic curved piece 12. In the present embodiment, the first insulation cover 13 at least covers the upper surface and the inner surface of the first sidewall 113, and surrounds the periphery of the first metallic curved piece 12 so that the outer metallic curved surface 121 of the first metallic curved piece 12 can be exposed. The first loop antenna AL1 is disposed at the side of the first insulation cover 13 opposite to the side surrounding the first metallic curved piece 12. In the present embodiment, the first loop antenna AL1 is disposed at the inner surface of the first sidewall 113, and the first metallic curved piece 12 is disposed at the outer surface of the first sidewall 113. That is, the first loop antenna AL1 is disposed at the inside of the first insulation cover 13, and the first metallic curved piece 12 is disposed at the outside of the first insulation cover 13, so that the first insulation cover 13 isolates the first loop antenna AL1 from the first metallic curved piece 12. In the present embodiment, both the upper surface 111 and the lower surface 112 of the metallic accommodating housing 11 can be used as the ground plane.

As shown in FIG. 6, the first loop antenna AL1 includes a first radiator RP1, a second radiator RP2 and a third radiator RP3. One end of the first radiator RP1 is coupled with the first metallic curved piece 12, and another end of the first radiator RP1 is coupled with the lower surface 112 as the ground G1. The second radiator RP2 is attached at the first insulation cover 13 and coupled with the lower surface 112 via the circuit board 20. The third radiator RP3 is attached at first insulation cover 13 and includes a first feed terminal F1. The first feed terminal F1 is coupled with the circuit board 20 to receive the first wireless radio-frequency signal. The first radiator RP1 and the second radiator RP2 are separately disposed, the second radiator RP2 and the third radiator RP3 are separately disposed, the first radiator RP1 and the third radiator RP3 are separately disposed, and the second radiator RP2 is located between the first radiator RP1 and the third radiator RP3. The first loop antenna AL1 generates a first band and a second band by resonance according to the first wireless radio-frequency signal after electromagnetically coupled with the first metallic curved piece 12, while the first band is lower than the second band. In the present embodiment, the first radiator RP1 is disposed at the outer surface of the first sidewall 113, the second radiator RP2 is disposed at the inner surface of the first sidewall 113, and the third radiator RP3 is disposed at the inner surface of the first sidewall 113. That is, the first radiator RP1 is disposed at the outside of the first insulation cover 13, the second radiator RP2 is disposed at the inside of the first insulation cover 13, and the third radiator RP3 is disposed at the inside of the first insulation cover 13.

In the present embodiment, the first loop antenna AL1 can be a flexible print circuit antenna supporting the third-generation mobile communication technology. The first loop antenna AL1 is driven as follow:

When the first wireless radio-frequency signal (the 3G radio-frequency signal) is fed to the first feed terminal F1 of the third radiator RP3, the areas a1 to a2 and areas a1 to a3 of the third radiator RP3 and the first radiator RP1 are electromagnetically coupled with the first metallic curved piece 12 to form an open-loop antenna architecture and generate a first band and a second band by resonance. Here, if the existence of the second radiator RP2 is not considered, the frequency of the first band generated by the first loop antenna, which is the low frequency portion among the 3G antenna radio-frequency signals, will be high. Note that the first band generated by the first loop antenna AL1 of the present embodiment by resonance is to be applied as the band of the third-generation mobile telecommunication technology operated at the low frequency spectral range of 824 MHz to 894 MHz, and the second band is to be applied as the band of the third-generation mobile telecommunication technology operated at the high frequency spectral range of 1710 MHz to 2170 MHz. To make the spectral range of the first band be 824 MHz to 894 MHz, and the spectral range of the second band be 1710 MHz to 2170 MHz, the first loop antenna AL1 includes the second radiator RP2. The area b1 to b2 and area b1 to b3 of the second radiator RP2 are coupled with the lower surface 112 via the circuit board 20. In other words, the first loop antenna AL1 has an additional path to be electromagnetically coupled with the ground, so that the frequency of the first band of the first loop antenna AL1 generated by resonance after being electromagnetically coupled with the first metallic curved piece 12 according to the first wireless radio-frequency signal is lower. Therefore, to the first loop antenna AL1, the first band generated by resonance using the first radiator RP1, the second radiator RP2 and the third radiator RP3 can conform to the low frequency spectral range of the third-generation mobile telecommunication technology (824 MHz to 894 MHz), and the second band can also conform to the high frequency spectral range of the third-generation mobile telecommunication technology (1710 MHz to 2170 MHz). In other embodiments, the impedance match bandwidth of the first loop antenna AL1 can be changed by adjusting the gap between the area b1 to b3 of the second radiator RP2 and the area a2 to a1 of the third radiator RP3. In the present embodiment, the gap mentioned above can be 1 mm.

In other embodiments, by adding a grounding path between the first radiator RP1 and the second radiator RP2, the spectral range of the low frequency can be changed. Referring to FIG. 7, the circuit board 20 further includes a coupling switch (not shown in the drawings), and the first loop antenna AL1 further includes a sixth radiator RPS. The circuit board 20 outputs a switch signal for the coupling switch to be selectively coupled with the sixth radiator RPS. The sixth radiator RPS is disposed between the first radiator RP1 and the second radiator RP2, and is disposed separately from the first radiator RP1 and the second radiator RP2. One end of the sixth radiator RPS is coupled with the first metallic curved piece 12, and when the coupling switch is coupled with the sixth radiator RPS, another end of the sixth radiator RPS is capable of being coupled with the lower surface 112 via the circuit board 20. For the first loop antenna AL1, a second band and a fifth band can be generated by resonance after being electromagnetically coupled with the first metallic curved piece 12 according to the first wireless radio-frequency signals using the sixth radiator RPS, the second radiator RP2 and the third radiator RP3 simultaneously, wherein the fifth band is higher than the first band and lower than the second band. In the present embodiment, the spectral range of the fifth band is 880 M-960 MHz. When the coupling switch is not coupled with the fifth radiator RPS, the spectral range of the low frequency generated by the first loop antenna AL1 is the first band. However, if the coupling switch is coupled with the sixth radiator RPS, since the position of the sixth radiator RPS is relatively closer to the second radiator RP2 than the first radiator RP1, a low frequency higher than the first band can be excited. Therefore, different low-frequency spectral ranges can be generated by adding grounding paths (such as the sixth radiator RPS), and the spectral range of the low frequency band of the first loop antenna AL1 can be selectively switched.

In other embodiments, referring to FIG. 1 to FIG. 5 and FIG. 8, the wearable electronic device 100 further includes a second metallic curved piece 14. The second metallic curved piece 14 is protrudingly disposed at the outside of the second sidewall 114 of the metallic accommodating housing 11, and the first metallic curved piece 12 is disposed with respect to the second metallic curved piece 14. The circuit board 20 is for providing a second radio-frequency signal. The wireless communication system 200 further includes a second insulation cover 15 and a second loop antenna AL2. The second insulation cover 15 wraps around the metallic accommodating housing 11 and covers a portion of the upper surface 111 of the metallic accommodating housing 11. One side of the second insulation cover 15 surrounds the second metallic curved piece 14. In the present embodiment, the second insulation cover 15 at least covers the upper surface and the inner surface of the second sidewall 114, and surrounds the periphery of the second metallic curved piece 14 so that the outer metallic curved surface 141 of the second metallic curved piece 14 can be exposed. The second loop antenna AL2 is disposed at the side of the second insulation cover 14 opposite to the side surrounding the second metallic curved piece 14. In the present embodiment, the second loop antenna AL2 is disposed at the inner surface of the second sidewall 114, and the second metallic curved piece 14 is disposed at the outer surface of the second sidewall 114. That is, the second loop antenna AL2 is disposed at the inside of the second insulation cover 15, and the second metallic curved piece 14 is disposed at the outside of the second insulation cover 15, so that the second insulation cover 15 isolates the second loop antenna AL2 from the second metallic curved piece 14.

As shown in FIG. 8, the second loop antenna AL2 includes a fourth radiator RP4 and a fifth radiator RP5. The fourth radiator RP4 is attached to the second insulation cover 15 and includes a second feed terminal F2. The second feed terminal F2 is coupled with the circuit board 20 to receive the second radio-frequency signal. One end of the fifth radiator RP5 is coupled with the second metallic curved piece 14, and another end is coupled with the lower surface 112 as a ground end G3. The fourth radiator RP4 and the fifth radiator RP5 are separately disposed. The second loop antenna AL2 generates a third band and a fourth band by resonance according to the second radio-frequency signal after being electromagnetically coupled with the second metallic curved piece 14, and the third band is lower than the fourth band. In the present embodiment, the fourth radiator RP4 is disposed at the inner surface of the second sidewall 114, and the fifth radiator RP5 is disposed at the outer surface of the second sidewall 114. That is, the fourth radiator RP4 is disposed at the inside of the second insulation cover 15, and the fifth radiator RP is disposed at the outside of the second insulation cover.

In the present embodiment, the second loop antenna AL2 can be a flexible printed circuit board antenna supporting GPS (Global Positioning System) and Bluetooth or Wi-Fi (Wireless Fidelity) signals. The second loop antenna AL2 can be driven as follow:

When the second radio-frequency signal (that is, the GPS and Bluetooth or Wi-Fi signal) is input to the second feed terminal F2 of the fourth radiator RP4, the areas d1 to d2 of the fourth radiator RP4 and the fifth radiator RP5 would electromagnetically couple with the second metallic curved piece 14 to form another open-loop antenna architecture to generate a third band and a fourth band by resonance. Therefore, to the second loop antenna AL2, by using the fourth radiator RP4 and the fifth radiator RP5 simultaneously, the third band and the fourth band generated by resonance can conform to the spectral ranges of GPS, Bluetooth and Wi-Fi standards (1575 M-1615 MHz and 2.4G-2.5 GHz). The spectral range of the third band of the present embodiment is 1575 M-1615 MHz, which conforms to the spectral range of GPS standard. The spectral range of the fourth band is 2.4-2.5 GHz, which conforms to the spectral ranges of Bluetooth and Wi-Fi standards. In other embodiments, the spectral range of the third band (that is, the spectral range of GPS) can be changed by adjusting the width and length of the areas d1 and d2 of the fourth radiator RP4.

In the wireless communication system 200, the circuit board 20 can be coupled with the first loop antenna AL1 and the second loop antenna AL2 by various ways. For example, please refer to FIG. 5, the circuit board 20 may include an elastic piece GP1, an elastic piece FP1 and an elastic piece FP2. The elastic piece GP1 can be coupled with another end of the second radiator RP2, so that the second radiator RP2 can be coupled with the lower surface 112 via the circuit board 20. The elastic piece FP1 can be coupled with the first feed terminal F1, so that the third radiator RP3 can receive the first wireless radio-frequency signal. The elastic piece FP2 can be coupled with the second feed terminal F2, so that the fourth radiator RP4 can receive the second radio-frequency signal. As mentioned previously, the circuit board 20 can use the elastic pieces to contact with the feed terminal and the ground terminal of the first loop antenna Al1 and the second loop antenna AL2, so that the circuit board 20 can be electrically coupled with the first loop antenna AL1 and the second loop antenna AL2. However, the wireless communication system 200 of the invention is not so limited. Any means that can electrically couple the circuit board 20 to the first loop antenna AL1 and the second loop antenna AL2 is within the scope of the invention. For example, the circuit board 20 can use a first coaxial line and a second coaxial line. The first wireless radio-frequency signal can be transmitted via the positive terminal of the first coaxial line to the first feed terminal F1 by the contact of the elastic piece. One end of the second radiator RP2 can be connected with the circuit board 20 to couple to the lower surface 112 via the negative terminal of the first coaxial line. Similarly, the second radio-frequency signal can be transmitted via the positive terminal of the second coaxial line to the second feed terminal F2 by the contact of the elastic piece. However, the two coaxial lines can be coupled with the feed terminal and the ground terminal of the corresponding antenna directly without an elastic piece.

Referring to FIG. 4, in other embodiments, the wireless communication system 200 further includes multiple elastic grounding pieces P1, P2, P3, P4, P5 and P6, wherein each of them are disposed at a back surface of the circuit board 20 to the upper surface 111 to ground via the lower surface 112 and provide a grounding path from the circuit board 20 to the lower surface 112 of the metallic accommodating housing 111. These elastic grounding pieces P1, P2, P3, P4, P5 and P6 are separately disposed at a side of the circuit board 20 near the first loop antenna AL1 or the second loop antenna AL2. The dispositions of the elastic grounding pieces can improve the problem that the ground plane area of the wearable electronic device is too small.

Please refer to FIG. 1 to FIG. 5, in other embodiments, the metallic accommodating housing 11 further includes a metallic belt 17. The metallic belt 17 is connected with the two sides of the metallic accommodating housing 11 disposing the first loop antenna AL1 and the second loop antenna AL2, respectively. More specifically, the metallic belt 17 is connected with the metallic accommodating housing 11 by a hinge made of metal to provide a grounding path to the metallic belt 17 and the lower surface 112 of the metallic accommodating housing 11. By providing the metallic belt 17, the grounding area of the wearable electronic device 100 is increased.

Please refer to FIG. 5, in other embodiments, a first gap exists between the side of the first insulation cover 13 disposing the first loop antenna AL1 (that is, the inner side of the first insulation cover 13) and the circuit board 20 to form an antenna clearance area AAR1, and a second gap exists between the side of the second insulation cover 15 disposing the second loop antenna AL2 (that is, inner side of the second insulation cover 15) and the circuit board 20 to form another antenna clearance area AAR2. The distance of the first gap between the circuit board 20 and the inner side of the first insulation cover 13 is 3 mm, and the distance of the second gap between the circuit board 20 and the inner side of the second insulation cover 15 is 2 mm. The first gap and the second gap are areas that do not have any electronic or metallic components. Therefore, to provide the first gap and the second gap can prevent the circuit or metallic component of the circuit board 20 that may become an electromagnetic interfering source from interfering the transmitting and receiving efficiencies of the first loop antenna AL1 and the second loop antenna. In the present embodiment, to provide the antenna clearance areas AAR1 and AAR2 can prevent the electromagnetic interferences from components such as a camera module 21 or a speaker 22 to affect the transmitting and receiving efficiency of the antenna. However, the invention is not so limited, and the camera module 21 or the speaker 22 are only the components considered in one embodiment.

In other embodiments, referring to FIGS. 1, 3 and 5, the wearable electronic device 100 further includes a metallic top cover 10, and the wireless communication system 200 further includes a first electric conductor CI1, a second electric conductor CI2 and a third electric conductor CI3, wherein the metallic top cover 10 is provided above the upper surface 111 of the metallic accommodating housing 11. More specifically, the first insulation cover 13 and the second insulation cover 15 are disposed between the metallic top cover 10 and the upper surface 111 of the metallic accommodating housing 11. One end y1 of the first electric conductor CI1 is coupled with the circuit board 20, and another end y2 is coupled with the second insulation cover 15 on the upper surface 111 of the metallic accommodating housing 11. One end z1 of the second electric conductor CI2 is coupled with the circuit board 20, and another end z2 is coupled with the second insulation cover 15 on the upper surface 111 of the metallic accommodating housing 11. The two ends x1 and x2 of the third electric conductor CI3 are attached between the first insulation cover 13 and the second insulation cover 15, and the end x1 is coupled with the circuit board 20. Providing the first electric conductor CI1, the second electric conductor CI2 and the third electric conductor CI3 is equivalent to adding multiple grounding paths to the circuit board 20, wherein the first electric conductor CI1 and the second electric conductor CI2 can improve the efficiency of the second loop antenna AL2, and the third electric conductor CI3 can improve the efficiency of the first loop antenna AL1.

To make the metallic top cover 10 not contact with the first electric conductor CI1, the second electric conductor CI2 and the third electric conductor CI3, in other embodiments, insulators (not shown in the drawings) can be use between the metallic top cover 10 and the first electric conductor CI1, the second electric conductors CI2 and the third electric conductor CI3 to prevent any electrical contact.

In other embodiments, referring to FIG. 1 and FIG. 3, slots (not shown in the drawing) can be formed at the portions of the metallic accommodating housing 11 shown in FIG. 1 being connected with the first metallic curved piece 12 and the second metallic curved piece 14. Here, the first insulation cover 13 and the second insulation cover 15 are not disposed, and the first insulation cover 13 and the second insulation cover 15 would wrap around the corresponding slots, respectively. Note that the wireless communication system 200 of the invention is not limited to be applied to a wearable electronic device 100. It can also be applied to other device with similar structures. In other embodiments, the first metallic curved piece 12 and the second metallic curved piece 14 can be integrally formed with the metallic accommodating housing 11.

Figure 9:
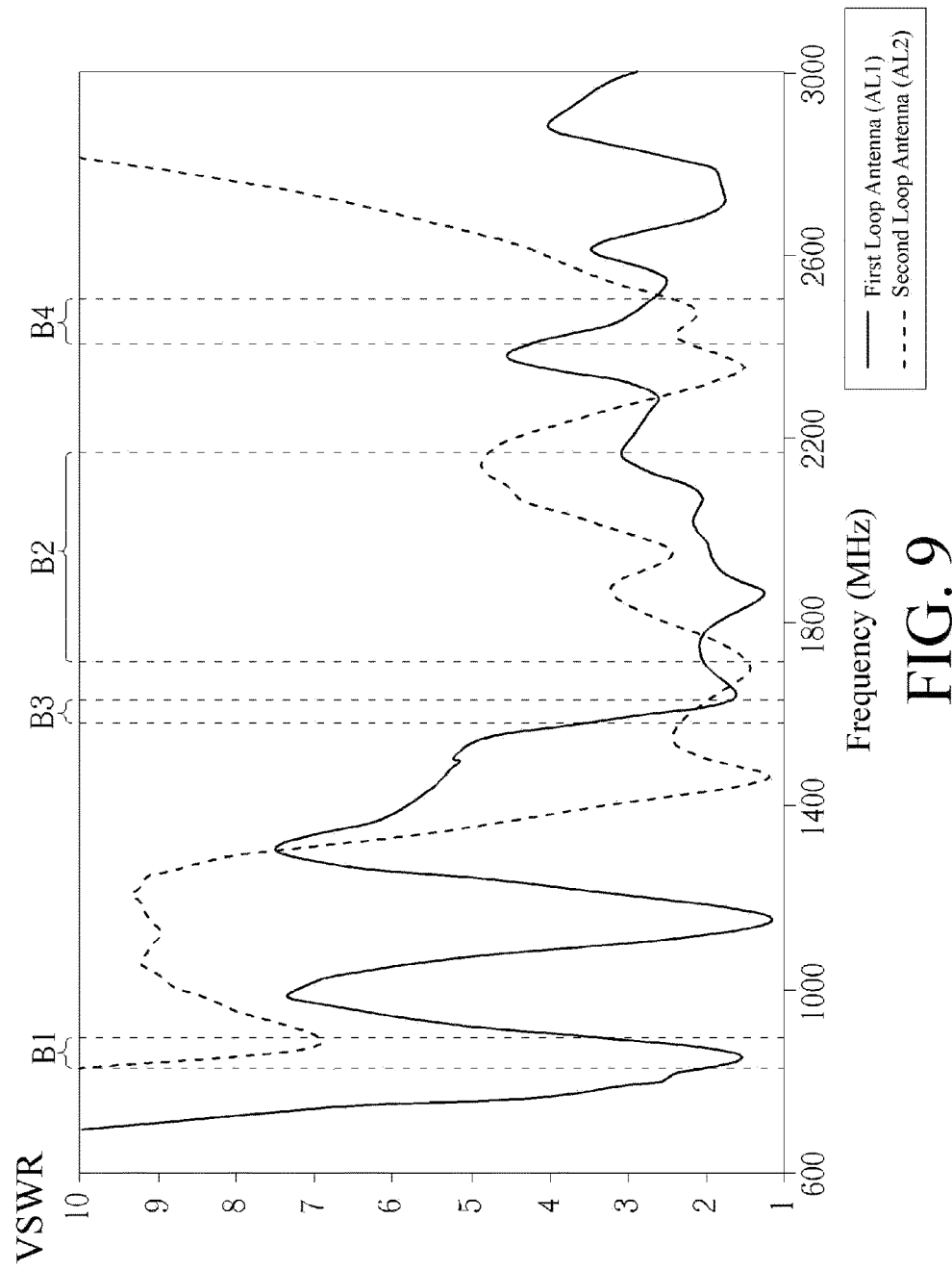
FIG. 9 is a schematic diagram showing the performances of VSWR (Voltage Standing Wave Ratio) of the first loop antenna and the second loop antenna in the wireless communication system of FIG. 5.

Please refer to FIG. 9, which is a diagram showing the VSWR (Voltage Standing Wave Ratio) when the first loop antenna AL1 and the second loop antenna AL2 are at the wearable electronic device 100. VSWR is a commonly used parameter in the wireless radio-frequency antenna field for determining whether the antenna components have a good impedance matching. The smaller the VSWR (closer to 1), the better the impedance matching of the antenna and thus the better signal transmission performance. To the contrary, the larger the VSWR, the worse the signal transmission performance since the signals would be under a pure standing wave state that is closer to total reflection with no energy transmission. Note that the performance shown in FIG. 9 means that the wireless communication system 200 is applied in the wearable electronic device 100, and the wearable electronic device 100 includes a metallic belt 17. In FIG. 9, the first loop antenna AL1 is an antenna supporting the $3^{rd}$ Generation telecommunication technology. The first band generated by the first loop antenna AL1 by resonance is ranged from 924 MHz to 894 MHz, and the VSWR value corresponds to the VSWR value of the frequency range designated by B1 in the drawing. The second band generated by the first loop antenna AL1 by resonance is ranged from 1710 MHz to 2170 MHz, and the VSWR value corresponds to the VSWR value of the frequency range designated by B2 in the drawing. The second loop antenna AL2 is an antenna supporting GPS and Bluetooth or Wi-Fi. The third band generated by the second loop antenna AL2 by resonance is ranged from 1575 MHz to 1615 MHz, and the VSWR value corresponds to the VSWR value of the frequency range designated by B3 in the drawing. The fourth band generated by the second loop antenna AL2 by resonance is ranged from 2.4 GHz to 2.5 GHz, and the VSWR value corresponds to the VSWR value of the frequency range designated by B4 in the drawing. As shown in FIG. 9, the VSWR values corresponding to the signals of the bands transmitted by the first loop antenna AL1 and the second loop antenna AL2 are smaller than 3, which means that the signal transmission performance is good.

Figure 10:
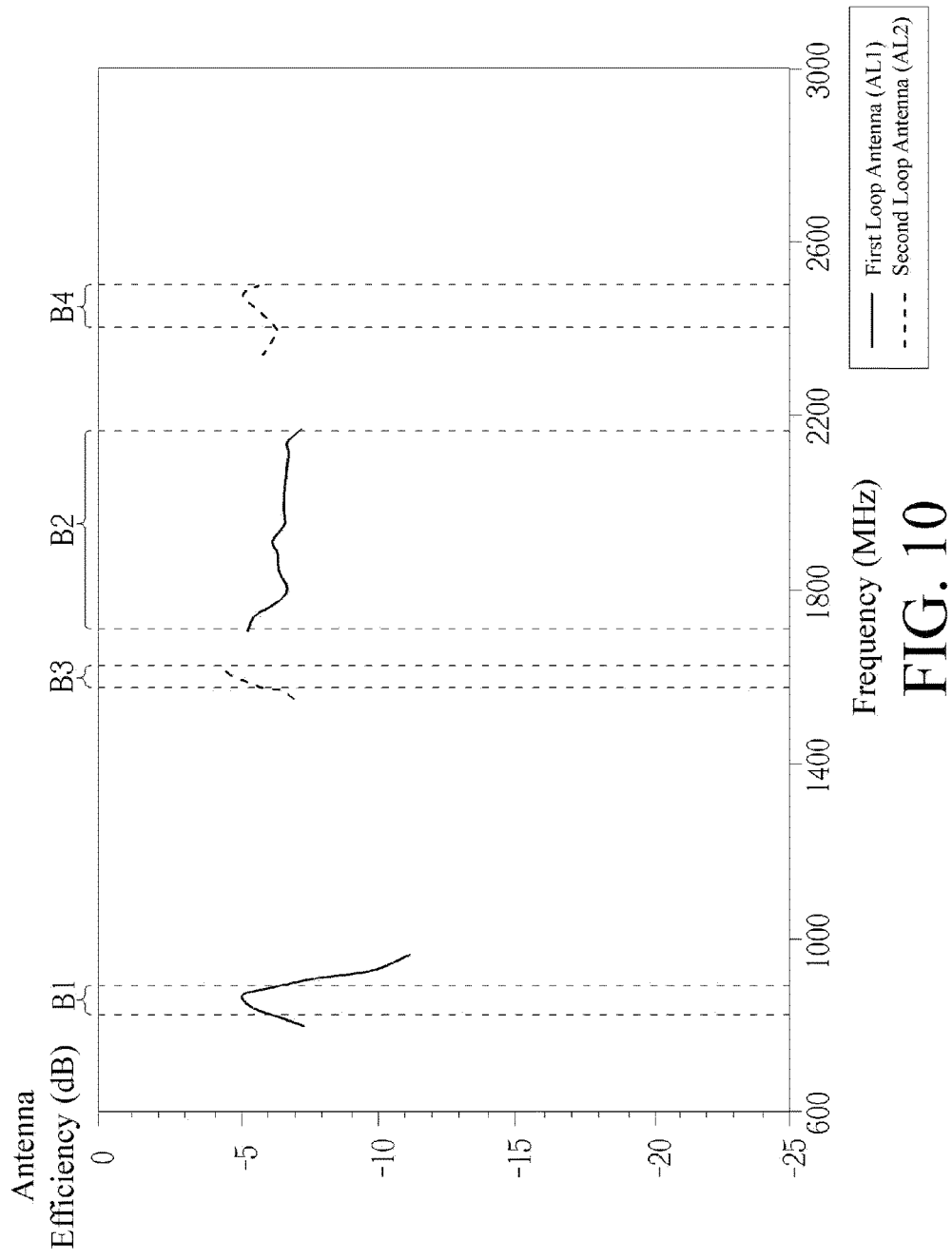
FIG. 10 is a schematic diagram showing the efficiencies of the first loop antenna and the second loop antenna in the wireless communication system of FIG. 5.

FIG. 10 is a schematic diagram showing the performance of the first loop antenna AL1 and the second loop antenna AL2 in the wireless communication system 200. Similar to the test conditions shown in FIG. 9, the wireless communication system 200 is applied to the wearable electronic device 100. The wearable electronic device 100 includes a metallic belt 17, and is tested without any accessory being attached. As shown in FIG. 10, the antenna efficiency of the first band correspond to the antenna efficiency of the frequency range designated by B1, which is −5.0 dB to −7 dB. The antenna efficiency of the second band correspond to the antenna efficiency of the frequency range designated by B2, which is −5.3 dB to −7 dB. The antenna efficiency of the third band correspond to the antenna efficiency of the frequency range designated by B3, which is −5.6 dB to −7.5 dB. The antenna efficiency of the fourth band correspond to the antenna efficiency of the frequency range designated by B4, which is −5.2 dB to −6.3 dB.

To sum up, the embodiment discloses a wearable electronic device and a wireless communication applied to the wearable electronic device. The wireless communication system has an antenna supporting the signal band of the $3^{rd}$ Generation telecommunication technology, and an antenna supporting the signal bands of GPS and Bluetooth or Wi-Fi. The two antennas can be flexible printed circuit boards attached to the first sidewall and the second sidewall respectively. Moreover, due to the applications of the elastic grounding pieces, the electrical conductors and the antenna clearance areas, the antenna transmitting and receiving performance is improved. By providing the metallic belt and the elastic grounding pieces, the wireless communication system of the wearable electronic device of the present embodiment resolves the problem of being difficult for the low frequency portion of the radio-frequency signals to generate resonant matching bandwidth due to the small area of the ground plane.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wireless communication system disposed at a wearable electronic device, the wearable electronic device including a metallic accommodating housing and a first metallic curved piece, the metallic accommodating housing including an upper surface and a lower surface, the lower surface being used as a ground plane, the first metallic curved piece being protrudingly disposed at one side of the metallic accommodating housing, the wireless communication system comprising:
    a circuit board accommodated at the metallic accommodating housing, the circuit board providing a first wireless radio-frequency signal;

a first insulation cover wrapping around the metallic accommodating housing and covering a portion of the upper surface, one side of the first insulation cover surrounding the first metallic curved piece; and a first loop antenna disposed at a side of the first insulation cover opposite to the side surrounding the first metallic curved piece, the first loop antenna including:

a first radiator, one end being coupled with the first metallic curved piece and another end being coupled with the lower surface, a second radiator attached to the first insulation cover and being coupled with the lower surface via the circuit board, and a third radiator attached to the first insulation cover and including a first feed terminal, the first feed terminal being coupled with the circuit board to receive the first wireless radio-frequency signal, wherein the first loop antenna generates a first band and a second band by resonance according to the first wireless radio-frequency signal after electromagnetically coupled with the first metallic curved piece.

2. The wireless communication system according to claim 1, wherein the circuit board further provides a second radio-frequency signal, the wearable electronic device further includes a second metallic curved piece, the second metallic curved piece is protrudingly disposed at another side of the metallic accommodating housing, and the first metallic curved piece is disposed with respect to the second metallic curved piece, the wireless communication system further comprises:

a second insulation cover wrapping around the metallic accommodating housing and covering a portion of the upper surface, one side of the second insulation cover surrounding the second metallic curved piece; and a second loop antenna disposed at a side opposite to the side of the second insulation cover surrounding the second metallic curved piece, the second loop antenna including:

a fourth radiator attached to the second insulation cover and including a second feed terminal, the second feed terminal being coupled with the circuit board to receive the second radio-frequency signal, and a fifth radiator one end being couple with the second metallic curved piece and another end being coupled with the lower surface, wherein the second loop antenna generates a third band and a fourth band by resonance according to the second wireless radio-frequency signal after electromagnetically coupled with the second metallic curved piece.

3. The wireless communication system according to claim 2, wherein a first gap exists between the side of the first insulation cover deposing the first loop antenna and the circuit board, and a second gap exists between the side of the second insulation cover disposing the second loop antenna and the circuit board.

4. The wireless communication system according to claim 2, further comprising a plurality of elastic grounding pieces, wherein the elastic grounding pieces are disposed at a back surface of the circuit board to abut the upper surface to ground via the lower surface, and the elastic grounding pieces are separately disposed at a side of the circuit board near the first loop antenna or the second loop antenna.

5. The wireless communication system according to claim 2, wherein the first radiator and the second radiator are separately disposed, the second radiator and the third radiator are separately disposed, the second radiator is located between the first radiator and the third radiator, and the fourth radiator and the fifth radiator are separately disposed.

6. The wireless communication system according to claim 5, wherein a spectral range of the first band is 824 MHz to 894 MHz, a spectral range of the second band is 1710 MHz to 2170 MHz, a spectral range of the third band is 1575 MHz to 1615 MHz, and a spectral range of the fourth band is 2.4 GHz to 2.5 GHz.

7. The wireless communication system according to claim 2, wherein the wearable electronic device further includes a metallic top cover, the wireless communication system further includes a first electric conductor, a second electric conductor and a third electric conductor, wherein the metallic top cover is disposed at the upper surface of the metallic accommodating housing, one end of the first electric conductor and one end of the second electric conductor are coupled with the circuit board, respectively, and another end of the first electric conductor and another end of the second electric conductor are coupled with the second insulation cover attached to the upper surface of the metallic accommodating housing, respectively, the third electric conductor is attached between the first insulation cover and the second insulation cover and one end of the third electric conductor is coupled with the circuit board.

8. The wireless communication system according to claim 7, wherein insulators are disposed between the metallic top cover and the first electric conductor, the second electric conductor and the third electric conductor, respectively.

9. The wireless communication system according to claim 2, wherein the metallic accommodating housing further includes a metallic belt, the metallic belt is connected with the metallic accommodating housing at two sides, respectively.

10. The wearable electronic device according to claim 2, wherein slots are formed at portions the metallic accommodating housing being connected with the first metallic curved piece and the second metallic curved piece, respectively, and the first insulation cover and the second insulation cover wrap around the corresponding slot, respectively.

11. The wireless communication system according to claim 1, wherein the circuit board further includes a coupling switch, the first loop antenna further includes a sixth radiator, the coupling switch is selectively coupled with the sixth radiator, the sixth radiator is disposed between the first radiator and the second radiator, one end of the sixth radiator is coupled with the first metallic curved piece, and another end is coupled with the lower surface via the circuit board, when the coupling switch is coupled with the sixth radiator, the first loop antenna generates the second band and the fifth band by resonance according to the first wireless radio-frequency signal after being electromagnetically coupled with the first metallic curved piece, wherein the fifth band is higher than the first band and lower than the second band.

12. A wearable electronic device, comprising:
a metallic accommodating housing including an upper surface and a lower surface, the lower surface being used as a ground plane;
a first metallic curved piece protrudingly disposed at one side of the metallic accommodating housing; and
a wireless communication system, including:
a circuit board accommodated at the metallic accommodating housing, the circuit board providing a first wireless radio-frequency signal;
a first insulation cover wrapping around the metallic accommodating housing and covering a portion of the upper surface, one side of the first insulation cover surrounding the first metallic curved piece; and a first loop antenna disposed at a side of the first insulation cover opposite to the side surrounding the first metallic curved piece, the first loop antenna including:
  a first radiator, one end being coupled with the first metallic curved piece and another end being coupled with the lower surface,
  a second radiator attached to the first insulation cover and being coupled with the lower surface via the circuit board, and
  a third radiator attached to the first insulation cover and including a first feed terminal, the first feed terminal being coupled with the circuit board to receive the first wireless radio-frequency signal,
wherein the first loop antenna generates a first band and a second band by resonance according to the first wireless radio-frequency signal after electromagnetically coupled with the first metallic curved piece.

13. The wearable electronic device according to claim 12, wherein the circuit board further provides a second radio-frequency signal, the wearable electronic device further includes a second metallic curved piece, the second metallic curved piece is protrudingly disposed at another side of the metallic accommodating housing, and the first metallic curved piece is disposed with respect to the second metallic curved piece, the wireless communication system further comprises:
  a second insulation cover wrapping around the metallic accommodating housing and covering a portion of the upper surface, one side of the second insulation cover surrounding the second metallic curved piece; and
  a second loop antenna disposed at a side opposite to the side of the second insulation cover surrounding the second metallic curved piece, the second loop antenna including:
    a fourth radiator attached to the second insulation cover and including a second feed terminal, the second feed terminal being coupled with the circuit board to receive the second radio-frequency signal, and
    a fifth radiator one end of which being couple with the second metallic curved piece and another end being coupled with the lower surface,
  wherein the second loop antenna generates a third band and a fourth band by resonance according to the second wireless radio-frequency signal after electromagnetically coupled with the second metallic curved piece.

14. The wearable electronic device according to claim 13, wherein a first gap exists between the side of the first insulation cover deposing the first loop antenna and the circuit board, and a second gap exists between the side of the second insulation cover disposing the second loop antenna and the circuit board.

15. The wearable electronic device according to claim 13, wherein slots are formed at portions the metallic accommodating housing being connected with the first metallic curved piece and the second metallic curved piece, respectively, and the first insulation cover and the second insulation cover wrap around the corresponding slot, respectively.

16. The wearable electronic device according to claim 13, wherein the wireless communication system further includes a plurality of elastic grounding pieces, wherein the elastic grounding pieces are disposed at a back surface of the circuit board and abut the upper surface to ground via the lower surface, and the elastic grounding pieces are separately disposed at a side of the circuit board near the first loop antenna or the second loop antenna.

17. The wearable electronic device according to claim 13, wherein the first radiator and the second radiator are separately disposed, the second radiator and the third radiator are separately disposed, the second radiator is located between the first radiator and the third radiator, and the fourth radiator and the fifth radiator are separately disposed.

18. The wearable electronic device according to claim 17, wherein a spectral range of the first band is 824 MHz to 894 MHz, a spectral range of the second band is 1710 MHz to 2170 MHz, a spectral range of the third band is 1575 MHz to 1615 MHz, and a spectral range of the fourth band is 2.4 GHz to 2.5 GHz.

19. The wearable electronic device according to claim 13, further comprising a metallic top cover, the wireless communication system further including a first electric conductor, a second electric conductor and a third electric conductor, wherein the metallic top cover is disposed at the upper surface of the metallic accommodating housing, one end of the first electric conductor and one end of the second electric conductor are coupled with the circuit board, respectively, and another end of the first electric conductor and another end of the second electric conductor are coupled with the second insulation cover attached to the upper surface of the metallic accommodating housing, respectively, the third electric conductor is attached between the first insulation cover and the second insulation cover and one end of the third electric conductor is coupled with the circuit board.

20. The wearable electronic device according to claim 19, wherein insulators are disposed between the metallic top cover and the first electric conductor, the second electric conductor and the third electric conductor, respectively.

21. The wearable electronic device according to claim 13, wherein the metallic accommodating housing further includes a metallic belt, the metallic belt is connected with the metallic accommodating housing at two sides, respectively.

22. The wearable electronic device according to claim 12, wherein the circuit board further includes a coupling switch, the first loop antenna further includes a sixth radiator, the coupling switch is selectively coupled with the sixth radiator, the sixth radiator is disposed between the first radiator and the second radiator, one end of the sixth radiator is coupled with the first metallic curved piece, and another end is coupled with the lower surface via the circuit board, when the coupling switch is coupled with the sixth radiator, the first loop antenna generates the second band and the fifth band by resonance according to the first wireless radio-frequency signal after being electromagnetically coupled with the first metallic curved piece, wherein the fifth band is higher than the first band and lower than the second band.

* * * * *